United States Patent
Pincu et al.

(10) Patent No.: US 7,259,325 B2
(45) Date of Patent: Aug. 21, 2007

(54) HIGH DENSITY FRONT ACCESS DEVICE

(75) Inventors: David Pincu, Holon (IL); Haim Epstein, Azur (IL)

(73) Assignee: PowerDsine, Ltd.-Microsemi Corporation, Hod Hasharon (IL)

( * ) Notice: Subject to any disclaimer, the term of this patent is extended or adjusted under 35 U.S.C. 154(b) by 36 days.

(21) Appl. No.: 11/061,650

(22) Filed: Feb. 22, 2005

(65) Prior Publication Data

US 2005/0201073 A1 Sep. 15, 2005

Related U.S. Application Data

(60) Provisional application No. 60/552,722, filed on Mar. 15, 2004.

(51) Int. Cl.
*H05K 5/00* (2006.01)
*H01R 29/00* (2006.01)

(52) U.S. Cl. .................. 174/50; 174/68.1; 174/68.3; 385/135; 361/797

(58) Field of Classification Search .............. 174/59, 174/50, 52.1, 15.2, 60, DIG. 9, 53, 57, 58, 174/68.1, 68.3, 520, 72 A; 361/797, 724, 361/600, 608, 610, 727, 728, 730, 752, 796, 361/829, 326; 220/3.2, 3.3, 3.4, 3.5, 3.6, 220/3.7, 3.8, 3.9, 4.02; 211/26; 248/200, 248/906; 385/134, 135
See application file for complete search history.

(56) References Cited

U.S. PATENT DOCUMENTS

| | | | |
|---|---|---|---|
| 5,801,921 A | 9/1998 | Miller | |
| 6,185,092 B1 | 2/2001 | Landrum et al. | |
| 6,301,095 B1* | 10/2001 | Laughlin et al. | ............ 361/624 |
| 6,307,750 B1* | 10/2001 | Bendikas et al. | ........... 361/725 |
| 6,473,608 B1 | 10/2002 | Lehr et al. | ................... 455/402 |
| 6,643,566 B1 | 11/2003 | Lehr et al. | ................... 700/286 |
| 6,708,830 B2* | 3/2004 | Mendoza | ..................... 211/26 |
| 2002/0170726 A1 | 11/2002 | Mendoza | |
| 2004/0035983 A1 | 2/2004 | Simonson et al. | |

FOREIGN PATENT DOCUMENTS

WO WO 02/103359 A1 12/2003

OTHER PUBLICATIONS

PCT/IL20005/000206- ISR, Jul. 6, 2005, PowerDsine, Ltd.

* cited by examiner

*Primary Examiner*—Angel R. Estrada
(74) *Attorney, Agent, or Firm*—Simon Kahn (57) ABSTRACT

A high density device comprising: a chassis frame configured and dimensioned for mounting in a standardized telecommunications rack, the chassis frame defining a front plane and a back plane, the front plane being substantially coincident with a front support of the telecommunications rack; a sub-module chassis secured to the chassis frame, the sub-module chassis exhibiting a proximal face and a distal face; a first plurality of jacks located distal of the proximal face of the sub-module chassis; and a passageway formed between the sub-module chassis and an inner wall of the chassis frame, the passageway configured and dimensioned for the passage of cabling for connection to the first plurality of jacks.

24 Claims, 10 Drawing Sheets

HIGH DENSITY FRONT ACCESS DEVICE

CROSS-REFERENCE TO RELATED APPLICATIONS

This application claims priority from U.S. Provisional Patent Application Ser. No. 60/552,722 filed Mar. 15, 2004 entitled "High Density Front Access Device" the contents of which are incorporated herein by reference.

BACKGROUND OF THE INVENTION

The present invention relates to the field of rack mounted telecommunication devices, and in particular to a device having front access jacks distal of the device face.

Electronic devices are often rack mounted, with a typical rack being 19" wide. A device designed for a standardized size rack having standardized input and output plugs or jacks is often referred to as a module. The height of a module is often defined in terms of multiples of a unit height, with 1 unit height being 1.75" or 44.45 mm.

Midspan equipment in a local area network, such as an IEEE 802.3 compliant Ethernet network, supplies added functionality to the local area network. Midspan equipment is typically supplied in a rack mounted module connected between the data circuit terminating equipment (DCE) module and the data terminating equipment (DTE). In one embodiment, such as that described in the IEEE 802.3af standard, midspan equipment is used to supply power to the DTE over the communication cabling.

In a typical 10 Base-T, 100. Base-T or 1000. Base-T based system, 4 sets of twisted wire pairs are used to connect each jack of the DCE to a DTE. Typically, the 4 sets of twisted wire pairs are terminated at each end in a single standardized connector, such as an RJ-45 connector. Alternatively, at the DCE end a Telco or CHAMP connector, available from Tyco Electronics, is used to gang multiple output ports on a single connector. In many installations cabling infrastructure is laid down prior to installation of any DCE and DTE. This is typically accomplished via a patch panel, with cabling from the intended DTE location being connected to a 110 punch down or Krone connection at the back of the patch panel. The front face of the patch panel presents a front side connection for each intended DTE location.

Connections in a telecommunication rack for which changes may need to be made during normal operations are typically supplied at the face of the modules, as access to the rear of the telecommunications rack is often difficult. Rear connections are normally reserved for power and data communications backbone connections, as these are not typically disturbed once the initial setup has been completed. In particular, in a typical communication rack assembly, cables for which changes may be made during normal operations are dressed in the front of the rack and cables for which changes are not normally made are dressed in the back of the rack.

For an application in which midspan equipment is utilized, each port of the DCE for which the midspan equipment is to provide functionality must be connected to the midspan equipment, and an output port from the midspan equipment for connection to the DTE must be supplied. Thus, the physical size of a midspan equipment module is at least a function of the number of input and output ports required.

Preferably, a rack mounted midspan equipment module should take up a minimum amount of rack space, and at the same time support a maximum number of input and output ports. As indicated above, for each port for which midspan functionality is supplied, ports for connection to both a DCE and a DTE must be supplied. A ganged housing of 12 RJ-45 jacks designed to fit into a 1 U height module is commercially available, comprising 6 pairs of vertically stacked RJ-45 jacks. Typically, a single RJ-45 jack is associated with a single port. Unfortunately, the maximum number of RJ-45 jacks which can be placed in the front panel of a 1 U height module of a standard 19" rack is no more than 56. Since for each port there is a corresponding output port, the maximum number of combined input and output ports supportable in a midspan device of the prior art is 28.

There is therefore a need for a device configuration which enables high density front access, and in particular a need for a configuration for a high density front access rack mounted module.

SUMMARY OF THE INVENTION

Accordingly, it is a principal object of the present invention to overcome the disadvantages of prior art methods of high density access, by configuring a module having accessible jacks on the front face of the device, and additional jacks which are located distal of the front face but proximal of the back face the device. Preferably, the additional jacks are accessible from the front of the device.

This is provided in the present invention by a high density front access device comprising: a chassis frame configured and dimensioned for mounting in a standardized telecommunications rack; a sub-module chassis secured to the chassis frame, the sub-module chassis exhibiting a proximal face and a distal face; a first plurality of jacks located distal of the proximal face of the sub-module chassis; and a passageway formed between the sub-module chassis and an inner wall of the chassis frame, the passageway configured and dimensioned for the passage of cabling for connection to the first plurality of jacks.

In one embodiment the high density device further comprises a second plurality of jacks appearing on the proximal face of the sub-module chassis. Preferably the high density device further comprises a network management jack appearing on the proximal face of the sub-module chassis.

In one embodiment the the first plurality of jacks appears on the distal face of the sub-module chassis. In one further embodiment the sub-module chassis is slideably connected to the chassis frame, the sub-module chassis having a first position in which front access to the first plurality of jacks is not supplied, and a second extended position in which front access to the first plurality of jacks is provided. In another further embodiment the sub-module chassis is pivotally connected to the chassis frame, the sub-module chassis having a first position in which front access to the first plurality of jacks is not supplied, and a second pivoted position in which front access to the first plurality of jacks is provided. In another further embodiment the sub-module chassis is slideably and pivotally connected to the chassis frame, the sub-module chassis having a first position in which front access to the first plurality of jacks is not supplied, and a second extended and pivoted position in which front access to the first plurality of jacks is provided.

In one embodiment at least one of the first plurality of jacks is secured to the sub-module chassis. In another embodiment the sub-module chassis is mounted in a drawer connected to the chassis frame. In yet another embodiment the sub-module chassis is removably secured to the chassis frame, the sub-module chassis being removed from the chassis frame to enable access to the first plurality of ports.

In yet another embodiment the sub-module chassis is slideably connected to the chassis frame, the sub-module chassis having a first position in which front access to the first plurality of jacks is not supplied, and a second extended position in which front access to the first plurality of jacks is provided.

In another embodiment the sub-module chassis is pivotally connected to the chassis frame, the sub-module chassis having a first position in which front access to the first plurality of jacks is not supplied, and a second pivoted position in which front access to the first plurality of jacks is provided. In yet another embodiment the sub-module chassis is slideably and pivotally connected to the chassis frame, the sub-module chassis having a first position in which front access to the first plurality of jacks is not supplied, and a second extended and pivoted position in which front access to the first plurality of jacks is provided.

In another embodiment the first plurality of jacks substantially define a plane, the plane being located proximal of point half way between a front plane defined by the chassis frame and a back plane defined by the chassis frame. In another embodiment the first plurality of jacks comprise at least one RJ-45 jack. In yet another embodiment the first plurality of jacks comprise at least one of a telecom jack and an Amp Champ jack.

In one embodiment the device further comprises a power supply, the power supply being connected to the chassis frame distal of the proximal face of the sub-module chassis. In another embodiment the chassis frame exhibits a flange, the flange at least partially defining the passageway. In yet another embodiment the device is a midspan power insertion equipment module supporting at least 40 ports in accordance with the IEEE 802.3 af—2003 standard.

In another embodiment the high density front access device further comprises a network management jack. Preferably the network management jack appears on the distal face of the sub-module chassis.

The invention independently provides for an apparatus for connecting a plurality of cables, the apparatus comprising: a chassis frame configured and dimensioned for mounting in a standardized telecommunications rack, the chassis frame exhibiting a front and a back; a sub-module chassis connected to the chassis frame, the sub-module chassis exhibiting a proximal face and a distal face, the proximal face of the sub-module chassis exhibiting unobstructed access from the chassis frame front; a first plurality of jacks secured to the sub-module chassis frame and exhibiting unobstructed access from the chassis frame front; and a second plurality of jacks located distal of the proximal face of the sub-module chassis and proximal of the back of the chassis frame.

In one embodiment at least one of the second plurality of jacks is secured to the sub-module chassis. In another embodiment the apparatus further comprises a passageway formed between the sub-module chassis and the chassis frame, the passageway being configured and dimensioned for the passage of at least one cable connected to the second plurality of jacks.

The invention independently provides for an apparatus for connecting a plurality of cables, the apparatus comprising: a chassis frame configured and dimensioned for mounting in a standardized telecommunications rack, the chassis frame defining a front and a back; a sub-module chassis connected to the chassis frame, the sub-module chassis exhibiting a front and a back; a first plurality of jacks secured to the sub-module chassis, the first plurality of jacks facing the back of the chassis frame; a second plurality of jacks secured to the sub-module chassis, the second plurality of jacks facing the front of the chassis frame; and a passageway formed between the sub-module chassis and the chassis frame, the passageway being configured and dimensioned for the passage of at least one cable connected to the first plurality of jacks.

The invention independently provides for a midspan power insertion module comprising: a chassis frame configured and dimensioned for mounting in a standardized telecommunications rack; a sub-module chassis secured to the chassis frame, the sub-module chassis exhibiting a proximal face and a distal face; a first plurality of jacks supporting least 40 ports located distal of the proximal face of the sub-module chassis; a second plurality of jacks supporting least 40 ports appearing on the proximal face of the sub-module chassis; and a passageway formed between the sub-module chassis and an inner wall of the chassis frame, the passageway configured and dimensioned for the passage of cabling for connection to the distally located jacks.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF PREFERRED EMBODIMENTS

The present embodiments enable a high density access device and in particular to a device having jacks located distal of the device face, the jacks being proximal of a plane defining the back of the device. Preferably the jacks are configured to allow connection to cables dressed on the front side of the rack, the cables being dressed through a passageway formed on at least one side of the device. Further preferably the device exhibits jacks coincident with the device face. In an exemplary embodiment, the device is a midspan equipment module, providing both input and output connections to at least 30 ports, preferably at least 40 ports. In a preferred embodiment, both input and output jacks for up to 48 ports are provided. Each of the output ports comprise 4 sets of twisted wire pairs. The device is herein illustrated with respect to the midspan equipment module embodiment, however this is only by way of explanation and is not meant to be limiting in any way.

In a preferred embodiment, the device is composed of a sub-module installed in a chassis frame, the sub-module comprising a sub-module chassis exhibiting a front and a back, the front of the sub-module chassis exhibiting a front face coincident with the front of the chassis frame. A set of jacks is associated with the front of the sub-module chassis and an additional set of jacks is associated with the back of the sub-module chassis. The back of the sub-module chassis is located proximal of the back of the chassis frame. Preferably, an additional jack for a network management connection is supplied. Space is provided between the side of the sub-module chassis and the chassis frame for the passage of wiring to/from the additional set of jacks.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

The term jack is used throughout this document to denote a socket or receptacle designed for mating with a connector. This is not meant to be limiting in any way, and is specifically meant to include both male and female connectors, sockets and fittings to which a cable having a mating connector or plug may be connected. The invention is being described in relation to a midspan equipment module, however this is not meant to be limiting in any way. The invention is equally applicable to DCE modules, including switches, routers and other rack mounted equipment supplied in modules having standardized connectors. A jack typically provides a connection to one or more ports of the device.

Figure 1:
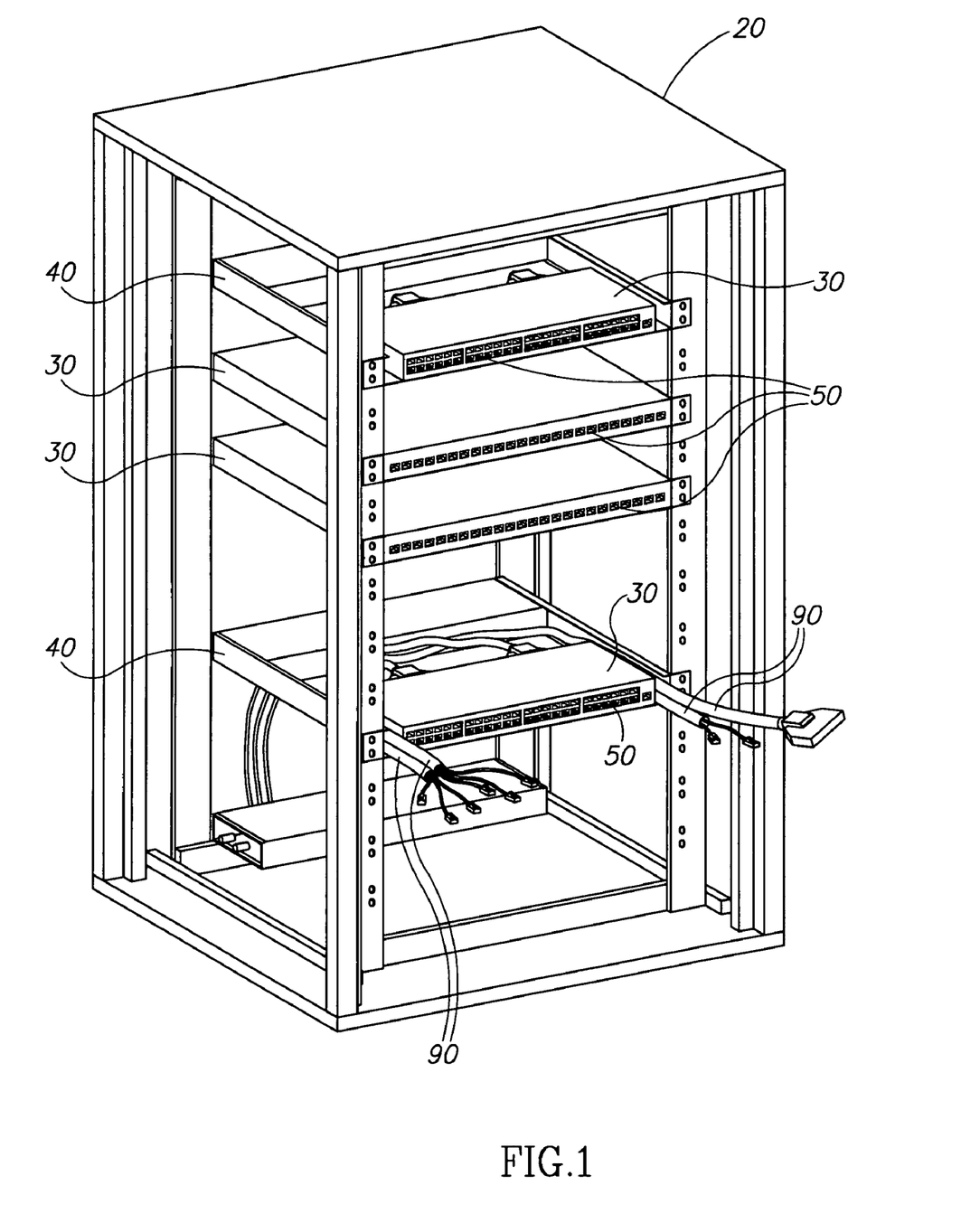
FIG. 1 is a high level drawing of an equipment rack having a midspan equipment module in accordance with the principle of the invention.

FIG. 1 is a high level drawing of an equipment rack 20 having a plurality of devices 30 including midspan equipment modules 40 in accordance with the principle of the invention. Jacks 50 for interconnection of each of the devices 30 in equipment rack 20 are positioned at the front of each device 30, for ease of field connection and maintenance. Midspan equipment modules 40 similarly feature jacks 50 located at the front of midspan equipment module 40. One midspan equipment module 90 exhibits cables 90 having a first end connected to midspan equipment module 40 at a jack located distal of a plane defining the front of midspan equipment module 40.

Figure 2:
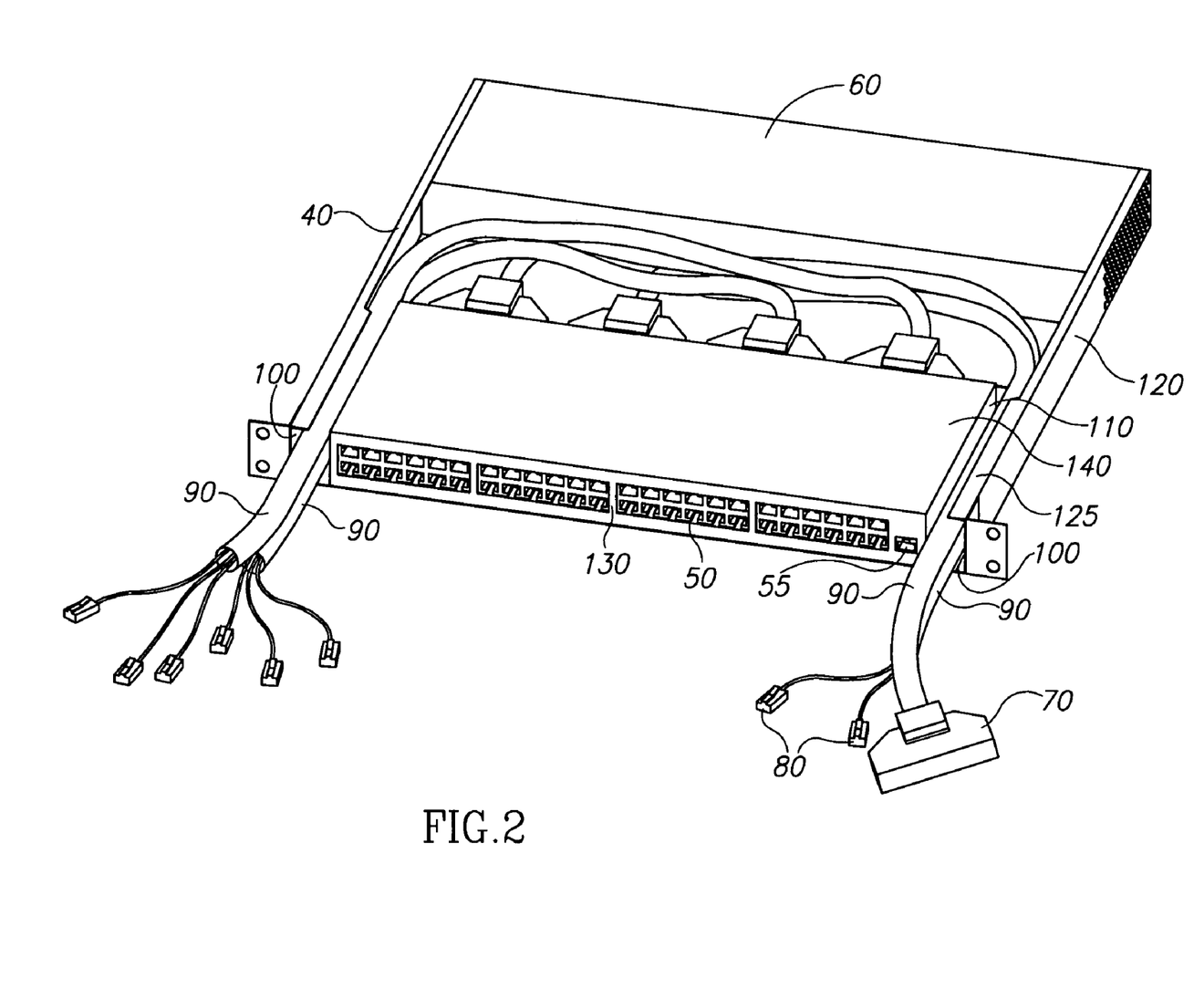
FIG. 2 is a high level perspective drawing depicting a frontal view of a midspan equipment module in accordance with the principle of the invention.

FIG. 2 is a high level perspective drawing depicting a frontal view of a midspan equipment module 40 of FIG. 1 in accordance with the principle of the invention. Midspan equipment module 40 comprises jacks 50 and network management jack 55; power supply 60; telecom connector 70; RJ-45 connector 80; cables 90; passageway 100; sub-module chassis 140 exhibiting side wall 110 and front or face 130; and chassis frame 120 exhibiting flange 125. Cables 90 are shown terminated at either end in either a telecom connector 70, such as an Amp Champ connector, or in an RJ-45 connector 80. Cables 90 are shown with one end connected to a jack distal of face 130. Passageway 100 is formed between frame 120 and said wall 110 of sub-module chassis 140. Power supply 60 is supplied at the back end of chassis frame 120 to operatively supply power to midspan equipment module 40. Flange 125 acts to partially define passageway 100 thereby preventing unwanted motion of cables 90. Jacks 50 and network management jack 55 are shown appearing at face 130 of sub-module chassis 140, with sub-module chassis 140 supplying both physical support to jacks 50 and network management jack 55 and a chassis location for internal electronics (not shown). In a preferred embodiment jacks 50 comprise RJ-45 jacks.

Figure 3:
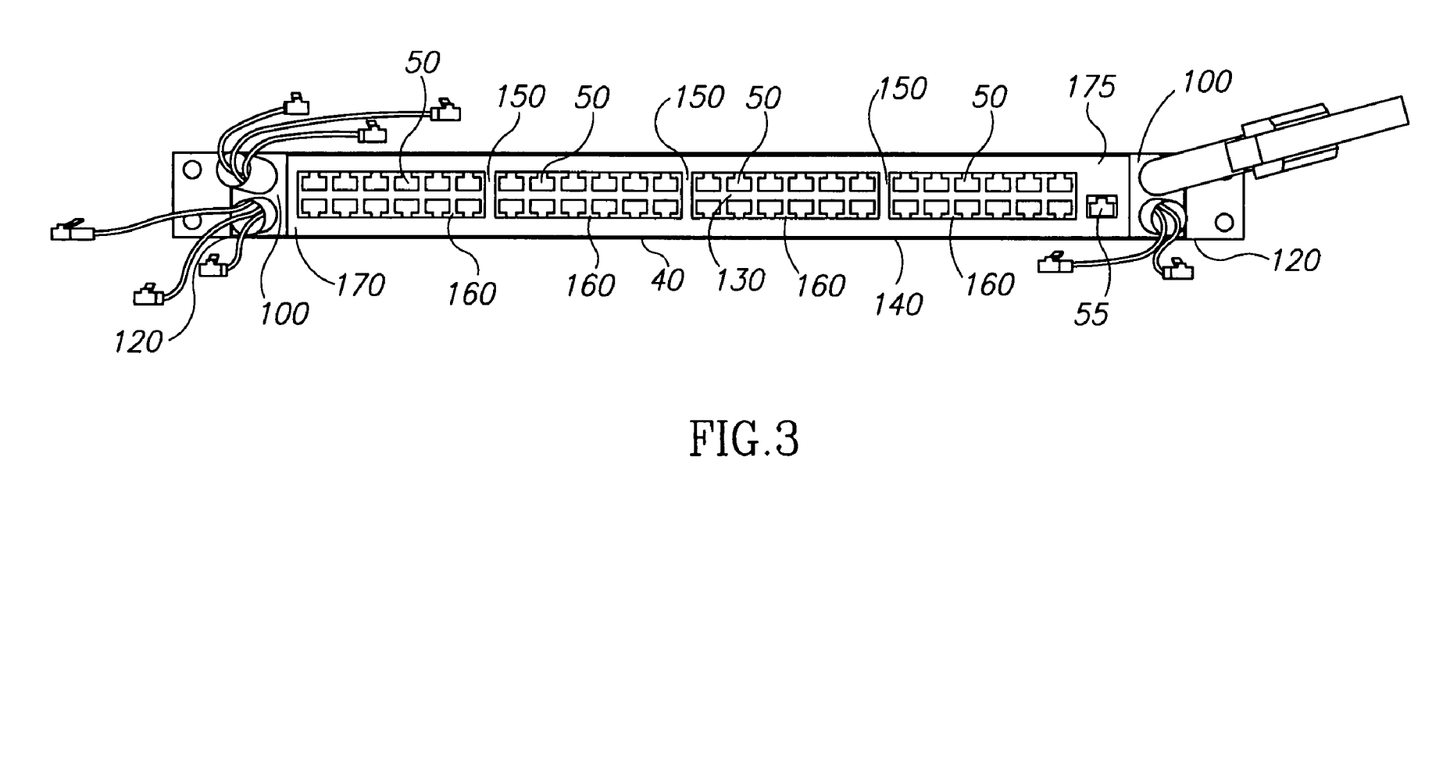
FIG. 3 is a high level drawing depicting a front view of a midspan equipment module in accordance with the principle of the invention.

FIG. 3 is a high level drawing depicting a front view of a midspan equipment module 40 in accordance with the principle of the invention. Midspan equipment module 40 comprises multiple ganged assemblies 160 of jacks 50 supported within sub-module chassis 140 and appearing on face 130. In a preferred embodiment, four ganged assemblies of twelve ganged RJ-45 jacks each are utilized, each ganged assembly comprising six vertically stacked pairs of RJ-45 jacks 50. A total of 48 ports, each port comprising an RJ-45 jack are thus supplied at face 130 of midspan equipment module 40. Additionally network management jack 55 is supplied at face 130. In another embodiment three ganged assemblies 160 comprising sixteen RJ-45 jacks each are utilized, each ganged assembly comprising 8 vertically stacked pairs of RJ-45 jacks 50. Strengthening members 150 are placed between each ganged assembly 160. Strengthening member 170 is placed at one end of the total of the ganged assemblies 160 defining one side of sub-module chassis 140. Strengthening member 175 is placed at the other end of the total of the ganged assemblies 160, having an opening formed therein for network management jack 55, strengthening member 175 defining a second side of sub-module chassis 140.

In a preferred embodiment, midspan equipment module 40 is designed to be utilized with a standard 19" rack, and exhibits an overall width of 19" or 482.6 mm. The recommended body width according to BS 5954 is 449 mm maximum, and typically only 430 mm is allowed in order to accommodate tolerances. Each ganged assembly 160 exhibits a width of 88 mm, and strengthening members 150 exhibit a width of 3 mm. First passageway 100 is formed between an end of strengthening member 170 and a wall defined by chassis frame 120. Second passageway 100 is formed between an end of strengthening member 175 and a wall defined by chassis frame 120. In a preferred embodiment passageways 100 are at least 25 mm in width and approximately 40 mm in height. In an exemplary embodiment, ganged modules 160 are comprised within sub-module chassis 140, and strengthening members 170 are part of sub-module chassis 140.

Figure 4A:
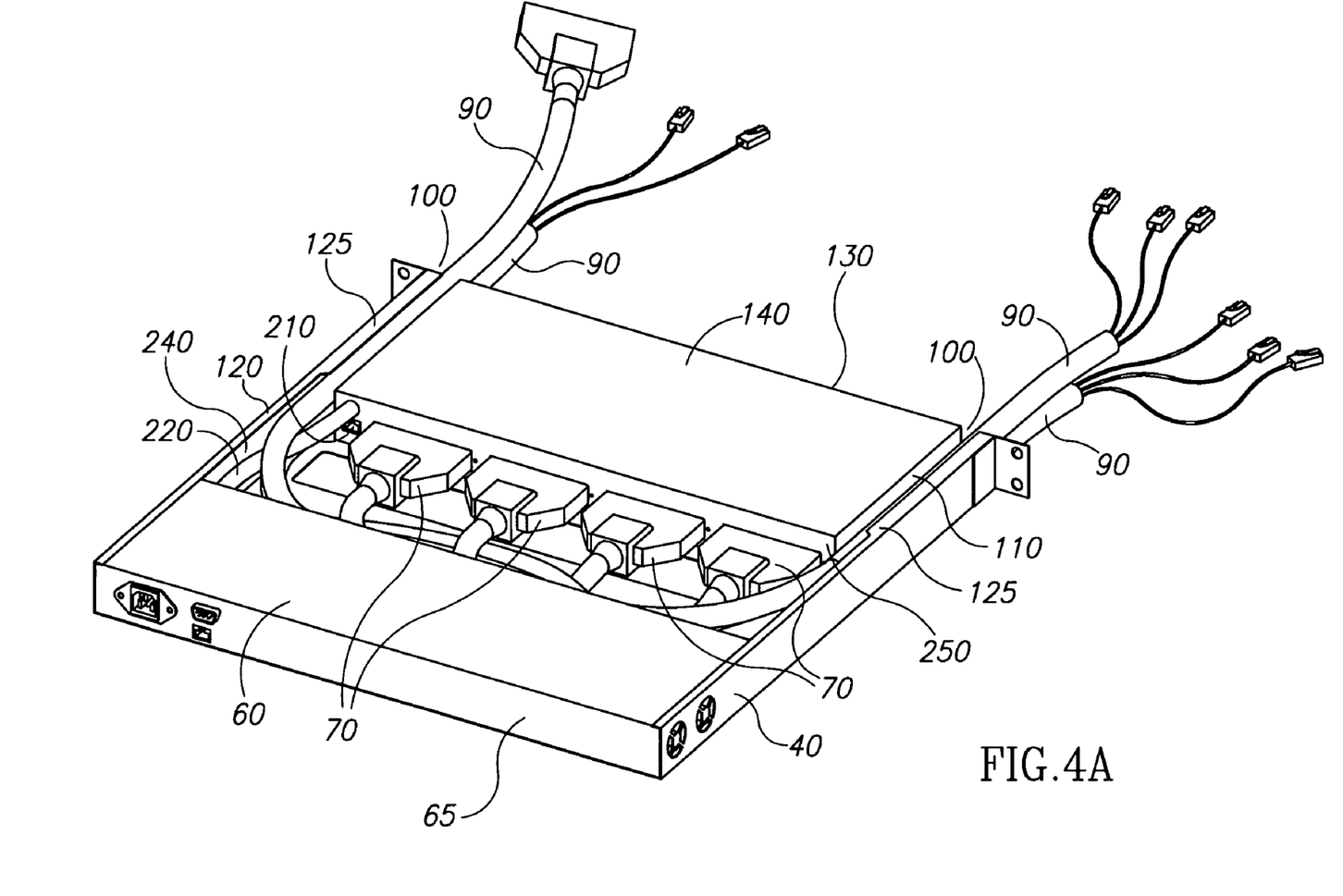
FIG. 4a is a high level perspective drawing depicting a first embodiment of a midspan equipment module in accordance with the principle of the invention.

FIG. 4*a* is a high level perspective drawing depicting a first embodiment of midspan equipment module 40 in accordance with the principle of the invention, comprising: chassis frame 120 exhibiting inner wall 240 and flange 125; Amp Champ connectors 70; sub-module chassis 140 having face 130, distal face 250, side wall 110, and network management jack 210; passageway 100; cables 90; power supply 60 exhibiting distal end 65; and power connection 220. Power supply 60 is situated at the rear of chassis frame 120 and is operatively connected to sub-module chassis 140 by power connection 220. Distal end 65 of power supply 60 is preferably coincident with, and forms the back face of, chassis frame 120. Cables 90 which terminate at one end in Amp Champ connectors 70 plugged into jacks located on distal face 250 of sub-module chassis 140 are passed through passageway 100 which is defined between an one inner wall 240 of chassis frame 120 and side wall 110 of sub-module chassis 140. A second end of each of cables 90 is terminated in a connector connected to a jack at associated modules (not shown) such as devices 30 of FIG. 1. Network management jack 210 is shown at the rear of sub-module chassis 140.

Midspan equipment module 40 is shown as having two equal passageways 100 on either side of sub-module chassis 140, however this is not meant to be limiting in any way. Passageways 100 may be of different sizes, or only a single passageway 100 may be formed between an inner wall 240 of chassis frame 120 and a side wall 110 of sub-module chassis 140 without exceeding the scope of the invention.

Connection of a termination for cables 90 distal of front face 130 of sub-module chassis 140 provides for a connection point to a DCE, without utilizing space on face 130 of midspan equipment module 40. Thus additional connection points are supplied, with passageway 100 provided to enable passage of cables 90. In a preferred embodiment distal face 250 is located less than half the distance between front of chassis frame 120 which is coincident with a plane defined by face 130 and the back of chassis frame 120 which is coincident with a plane defined by distal end 65. Thus, in a preferred embodiment, the additional connection points are located on distal face 250 located distal of a plane defined by face 130 and proximal of a plane defined by distal end 65. In the embodiment shown the additional connection points are located on distal face 250 facing away from the front of chassis 120, however this is not meant to be limiting in any way. The additional connection points may face the front of chassis 120, for example by appearing on a proximal face of power supply 65, without exceeding the scope of the invention.

Figure 4B:
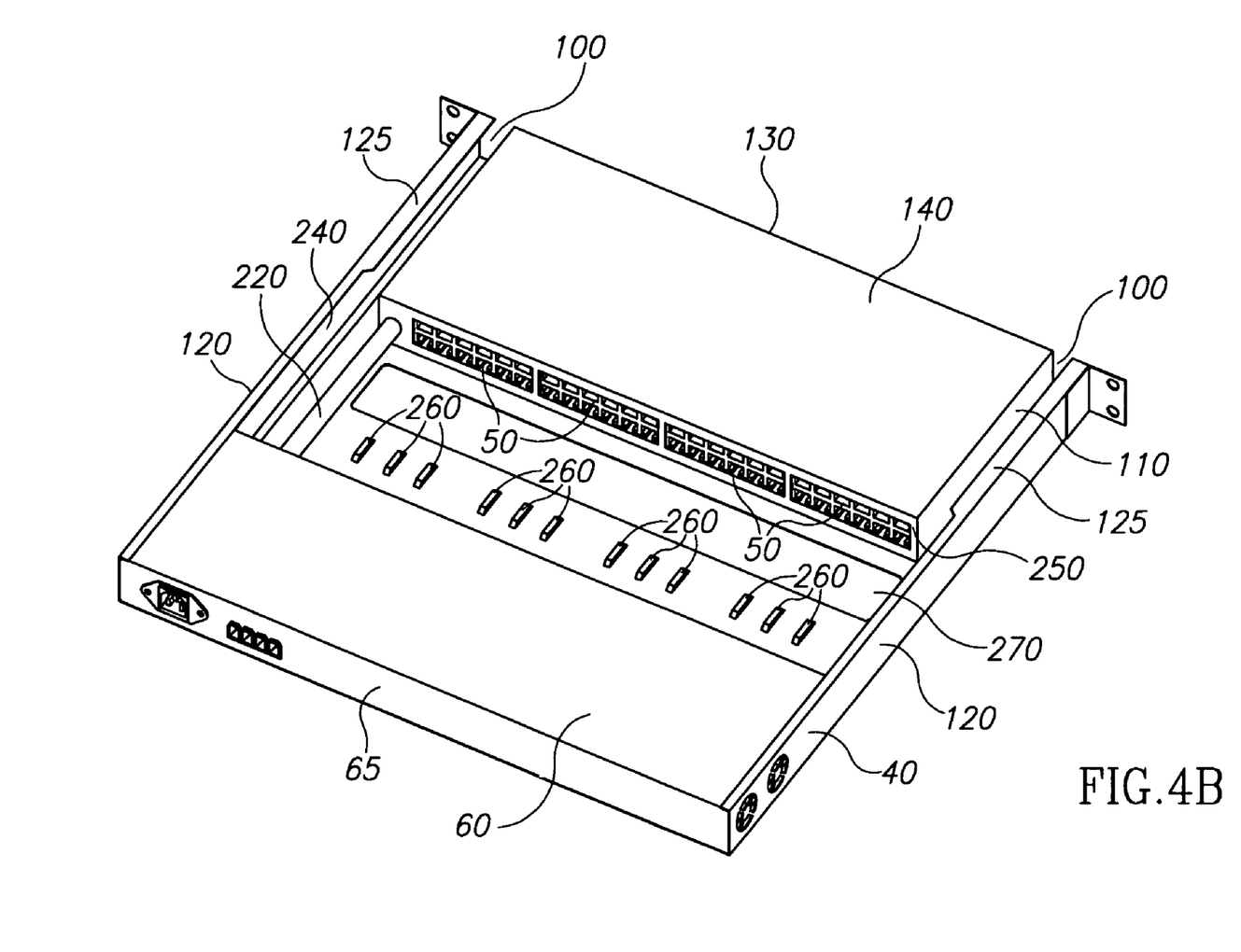
FIG. 4b is a high level perspective drawing depicting a second embodiment of a midspan equipment module in accordance with the principle of the invention.

FIG. 4*b* is a high level perspective drawing depicting a second embodiment of midspan equipment module 40 in accordance with the principle of the invention, comprising: chassis frame 120 exhibiting inner wall 240 and flange 125; sub-module chassis 140 exhibiting face 130, distal face 250, RJ-45 connectors 50 and side wall 110; passageways 100; power supply 60 exhibiting distal end 65; power connection 220; opening 270; and cable tie down points 260. Power supply 60 is situated at the rear of midspan equipment module 40 and is operatively connected to sub-module chassis 140 by power connection 220. Distal end 65 is coincident with, and forms the back face of, chassis frame 120. For clarity cables have been omitted. RJ-45 connectors 50 located on distal face 250 of sub-module chassis 140 receive cables via passageway 100 defined between inner wall 240 of chassis frame 120 and side wall 110 of sub-module chassis 140. Opening 270 in the bottom wall of chassis frame 120 eases disconnection of RJ-45 plugs (not shown) from RJ-45 connectors 50. Cable tie down points 260 provide for dressing leads entering via passageway 100 for connection to RJ-45 connectors 80.

Midspan equipment module 40 is shown as having two equal passageways 100 on either side of sub-module chassis 140, however this is not meant to be limiting in any way. Passageways 100 may be of different sizes, or only a single large passageway 100 may be formed between an inner wall 240 of chassis frame 120 and a side wall 110 of sub-module chassis 140 without exceeding the scope of the invention.

A connection point distal of face 130 of sub-module chassis 140 provides for additional connection points, with at least one passageway 100 defined by flange 125, inner wall 240 and side wall 110 providing space for the passage of appropriate cabling. In a preferred embodiment distal face 250 is located less than half the distance between front of chassis frame 120 substantially coincident with face 130 and the back of chassis frame 120 substantially coincident with a plane defined by distal end 65. Thus, in a preferred embodiment, the additional connection points are located on distal face 250 which is located distal of face 130 and proximal of distal end 65.

In the embodiment shown the additional connection points are located on distal face 250 facing away from the front of chassis 120, however this is not meant to be limiting in any way. The additional connection points may face the front of chassis 120, for example by appearing on a proximal face of power supply 65, without exceeding the scope of the invention.

Midspan equipment module 40 thus is operative to support over 30 ports, by supplying connection points for at least 30 input ports and 30 output ports. In an exemplary embodiment at least 40 ports are supported and preferably 48 ports are supported, each port preferably being powered in accordance with IEEE 802.3 af—2003 the contents of which are incorporated herein by reference.

Figure 5:
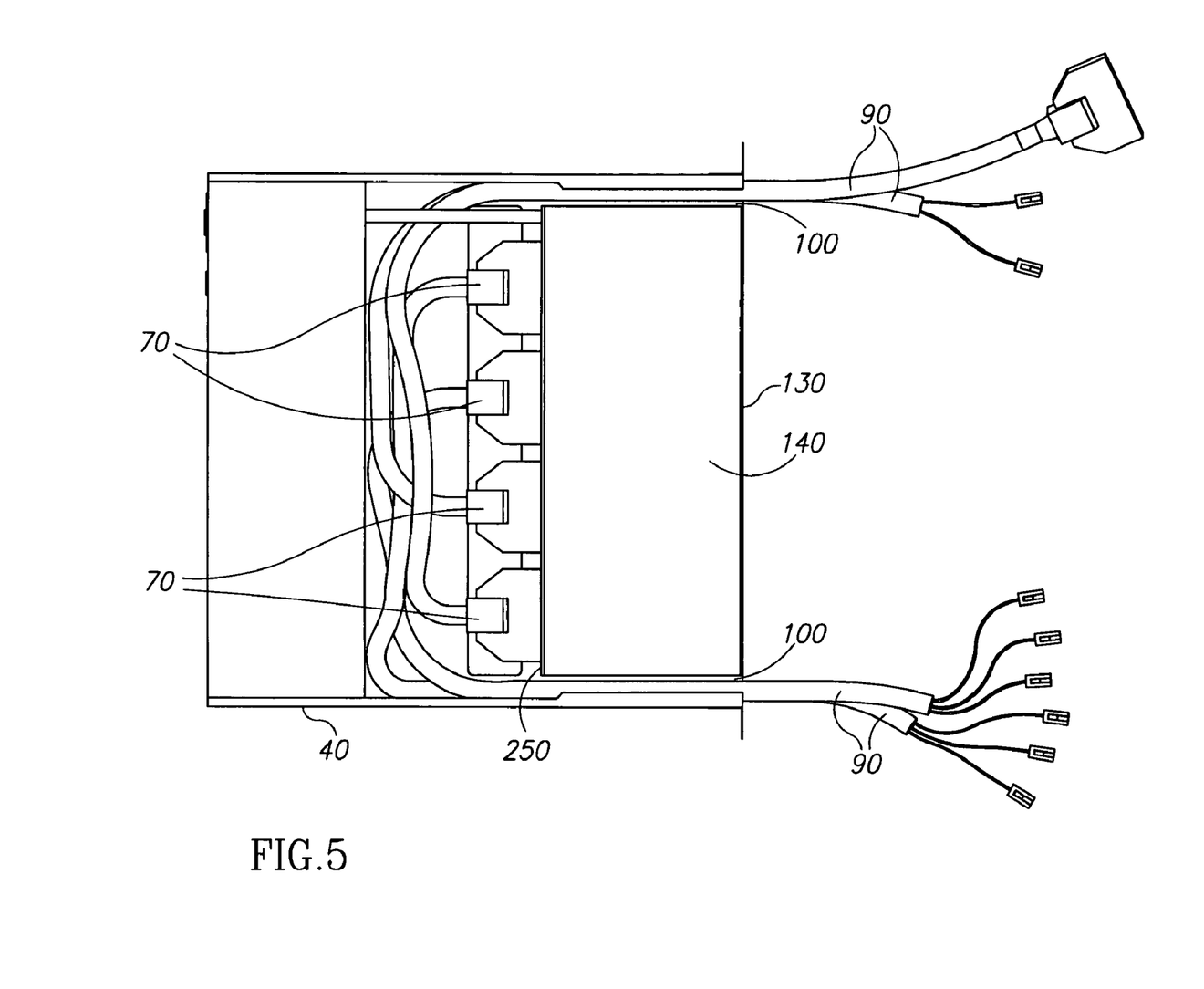
FIG. 5 is a high level drawing depicting a top view of a midspan equipment module in accordance with the principle of the invention.

FIG. 5 is a high level drawing depicting a top view of a midspan equipment module 40 in accordance with the first embodiment of the principle of the invention. Telecom connectors 70, shown here as Amp Champ connectors, are connected at distal face 250 of sub-module chassis 140, and cables 90 are passed through passageway 100. Distal face 250 is located distally of face 130, and is herein illustrated as facing the back of midspan equipment module 40. It is to be understood that distal face 250 may be forward facing without exceeding the scope of the invention. Although Amp Champ connectors 70 are depicted, it is to be understood that any connector may be utilized, including but not limited to Telco connectors and RJ-45 connectors without exceeding the scope of the invention. Preferably passageway 100 is of sufficient size to contain cables 90.

Figure 6:
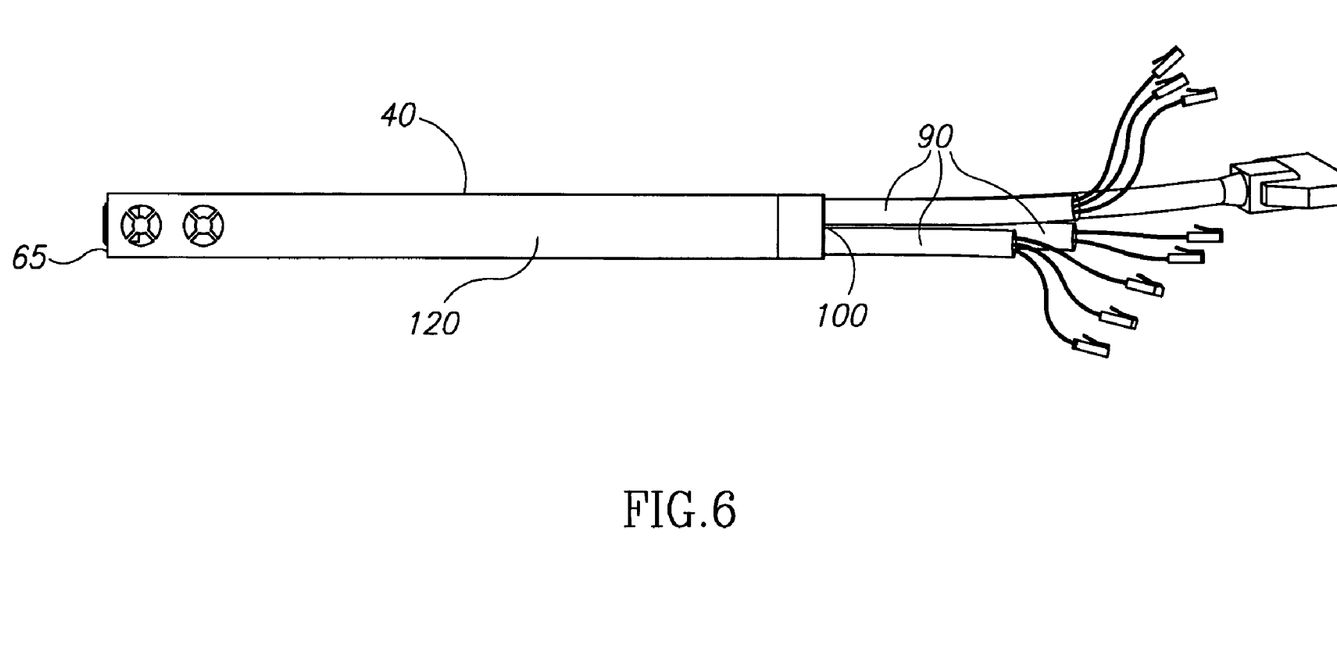
FIG. 6 is a high level drawing depicting a side view of a midspan equipment module in accordance with the principle of the invention.

FIG. 6 is a high level drawing depicting a side view of a midspan equipment module 40 in accordance with the principle of the invention depicting chassis frame 120, distal end 65 and cables 90 extending for connection to other devices 30 (not shown). Cables 90 are shown dressed vertically stacked, as in an exemplary embodiment each passageway 100 exhibits a height of approximately 40 mm with a width of only 25 mm.

Figure 7:
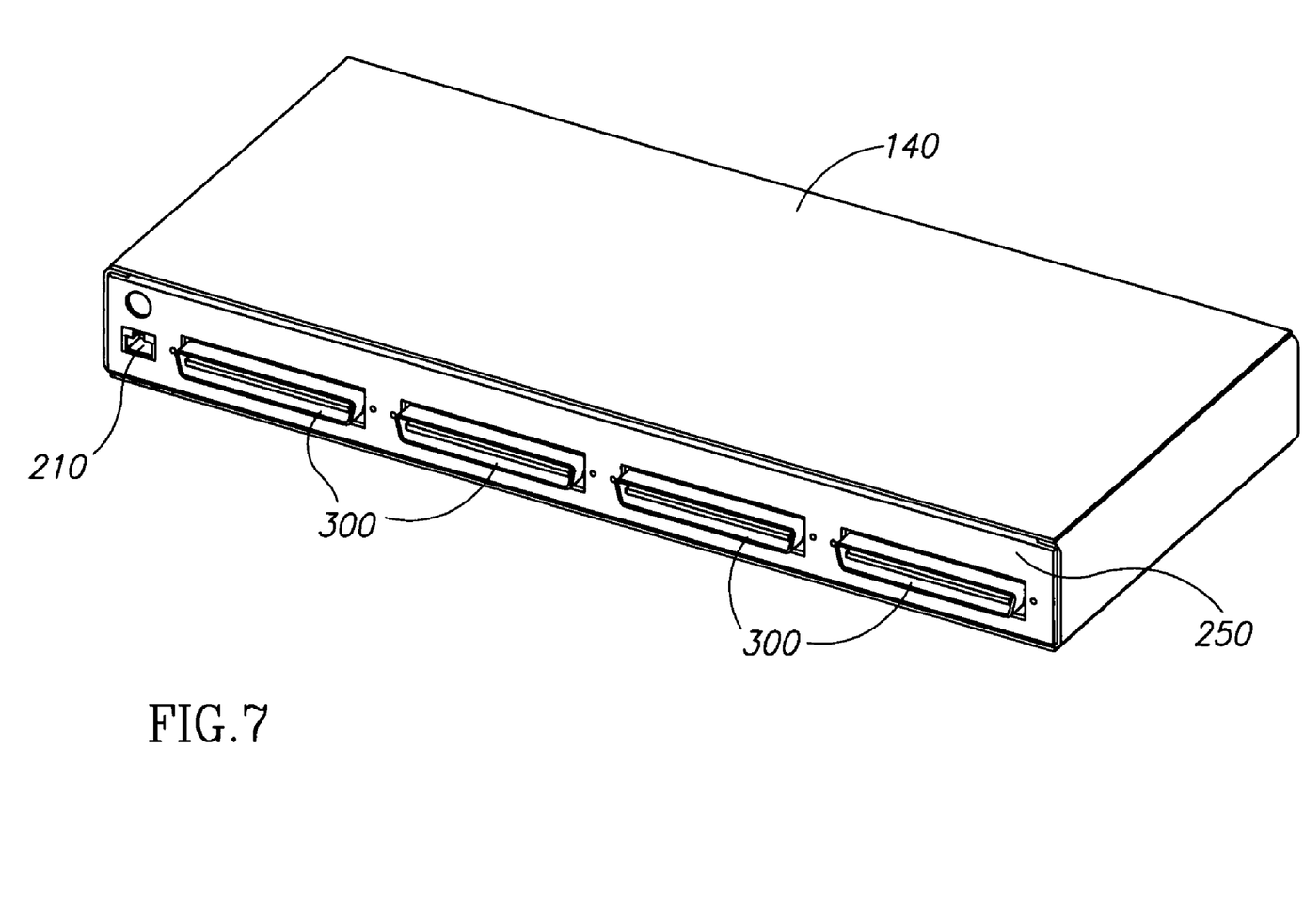
FIG. 7 is a high level perspective drawing depicting a rear view of a sub-module chassis having connector jacks in accordance with the principle of the invention.

FIG. 7 is a high level perspective drawing depicting a rear view of an embodiment of sub-module chassis 140 having jacks 300 and network management jack 210 appearing on distal face 250 in accordance with the principle of the invention. Four jacks 300 are shown, however this is not meant to be limiting in any way. Jacks 300 are designed to mate with telecom connectors 70.

The above has been described as having the output to a DTE at the face of midspan equipment module 40, and the input from a DCE connected distally of the face. This is not mean to be limiting in any way. The output may be connected distally of the face of the module, and the input may be connected to the face of the module without exceeding the scope of the invention. Similarly, some of the inputs may be connected to the face of the module, and some connected distally of the face of the module; some of the outputs may be connected to the face of the module and some connected distally of the face of the module without exceeding the scope of the invention.

Figure 8A:
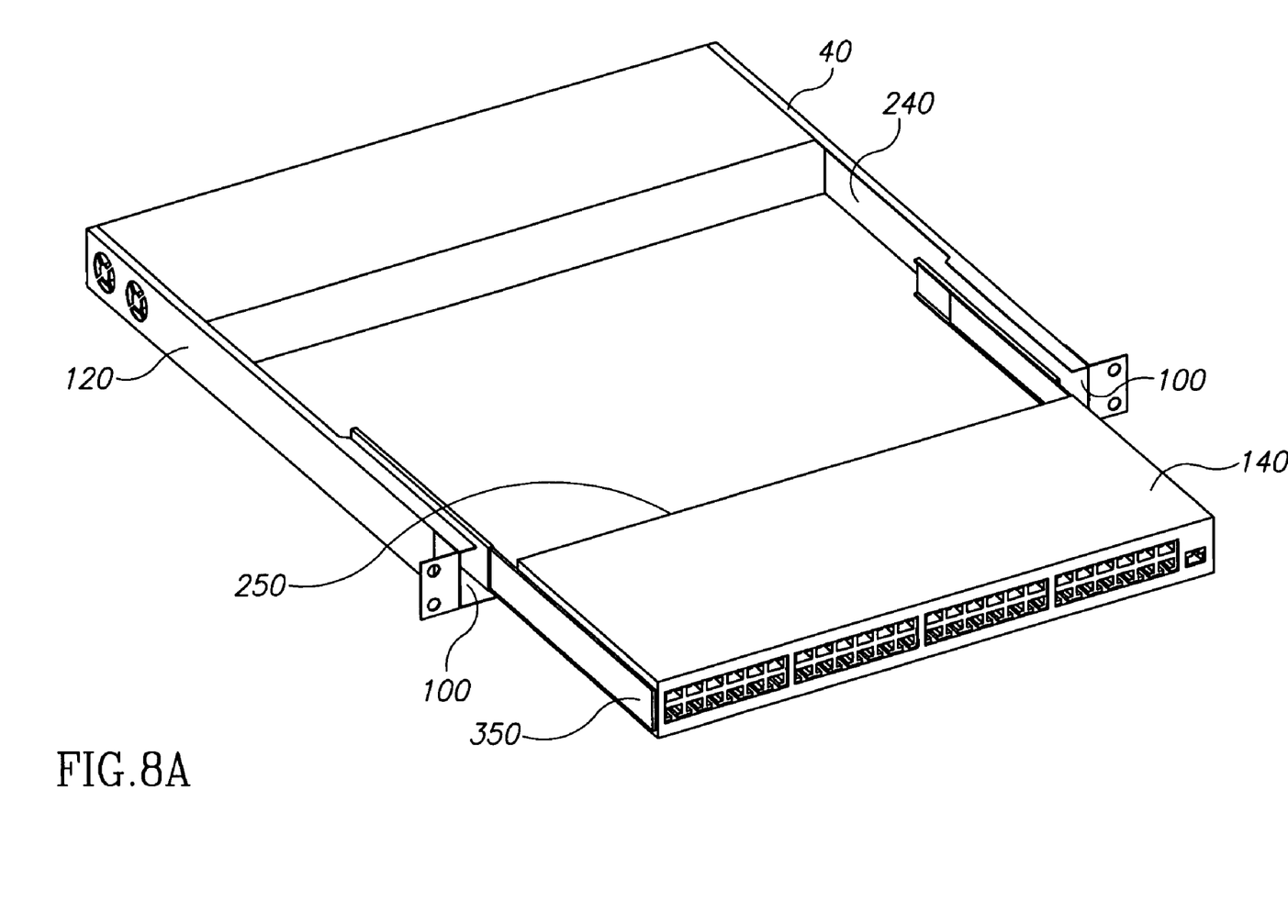
FIG. 8a illustrates a high level perspective drawing of a midspan equipment module in which a sub-module chassis is slideably connected to a chassis frame enabling access to jacks appearing on a distal face of the sub-module chassis in an extended position.

The above has been described as having a fixed sub-module chassis 140 secured to chassis 120. Thus access to connection points distal of the front face may require partial removal of midspan equipment module 40 comprising chassis frame 120 from equipment rack 20. FIG. 8a illustrates a high level perspective drawing of a midspan equipment module 40 in which sub-module chassis 140 is slideably connected to chassis frame 120 by glides 350, sub-module chassis 140 being illustrated in an extended position. Passageway 100 is formed between glide 350 and inner wall 240 of chassis frame 120. Connection points located on distal face 250 are thus accessible without removing midspan equipment module 40 from equipment rack 20 by withdrawing sub-module 140 to an extended position.

Figure 8B:
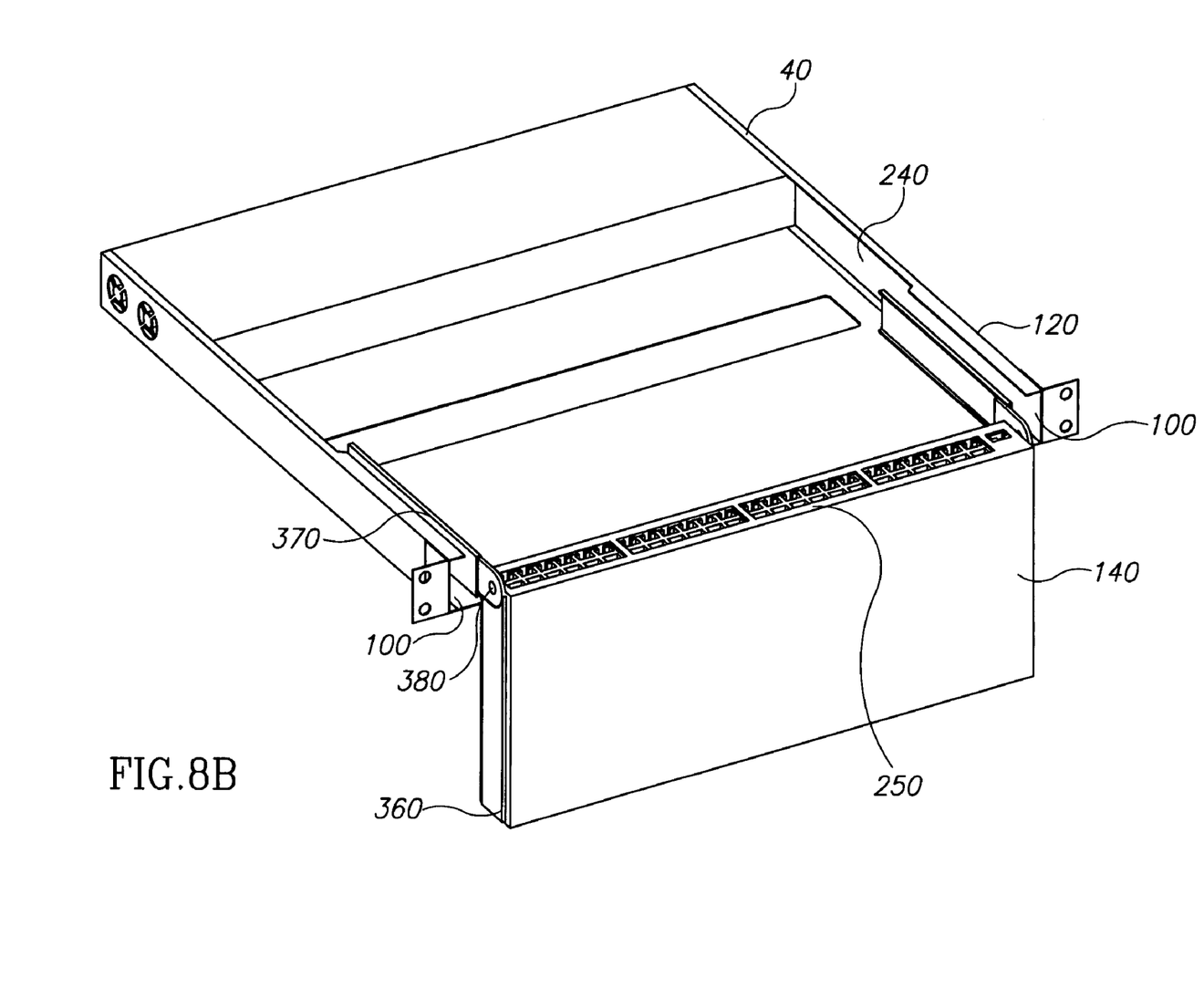
FIG. 8b illustrates a high level perspective drawing of a midspan equipment module in which a sub-module chassis is slideably and pivotally connected to a chassis frame enabling access to jacks appearing on a distal face of the sub-module chassis in an extended and pivoted position.

FIG. 8b illustrates a high level perspective drawing of a midspan equipment module 40 in which sub-module chassis 140 is slideably and pivotally connected to chassis frame 120 by grooves 360 slideably held by slides 370 and pivot 380, sub-module chassis 140 being illustrated in an extended and pivoted position. Passageways 100 are formed between slides 370 and inner wall 240 of chassis frame 120. Grooves 360 are formed in sub-module chassis 140 to mate with slides 370 thereby securing sub-module chassis 140 in a non-extended position (not shown). After complete extension, pivot 380 serves to pivotally secure sub-module chassis 140 while presenting distal face 250.

The above embodiments are not meant to be limiting in any way, and is described herein only as a non-limiting example of a means of access to distal face 250. Sub-module chassis 140 may be pivotally mounted; mounted within a drawer or drawer assembly; or mounted as a removable assembly without exceeding the scope of the invention.

Thus the present embodiments enable a high density access device and in particular to a device having jacks located distal of the device face, the jacks being proximal of a plane defining the back of the device. Preferably the jacks are configured to allow connection to cables dressed on the front side of the rack, the cables being dressed through a passageway formed on at least one side of the device. Further preferably the device exhibits jacks substantially coincident with the device face. In an exemplary embodiment, the device is a midspan equipment module, providing both input and output connections to at least 30 ports, preferably at least 40 ports and even further preferably 48 ports.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable subcombination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described hereinabove. Rather the scope of the present invention is defined by the appended claims and includes both combinations and subcombinations of the various features described hereinabove as well as variations and modifications thereof which would occur to persons skilled in the art upon reading the foregoing description and which are not in the prior art.

We claim:

1. A high density device comprising:
   a chassis frame configured and dimensioned for mounting in a standardized telecommunications rack;
   a sub-module chassis secured to said chassis frame, said sub-module chassis exhibiting a proximal face and a distal face;
   a first plurality of jacks secured to said sub-module chassis and located distal of said proximal face of said sub-module chassis; and
   a passageway defined between said sub-module chassis and an inner wall of said chassis frame, wherein said passageway enables the passage of cabling connected to said first plurality of jacks to a point substantially coplanar with said proximal face.

2. A high density device according to claim 1, further comprising a second plurality of jacks appearing on said proximal face of said sub-module chassis.

3. A high density device according to claim 2, further comprising a network management jack appearing on said proximal face of said sub-module chassis.

4. A high density device according to claim 1, wherein said first plurality of jacks appears on said distal face of said sub-module chassis.

5. A high density access device according to claim 4, wherein said sub-module chassis is slideably connected to said chassis frame, said sub-module chassis having a first position in which front access to said first plurality of jacks is not supplied, and a second extended position in which front access to said first plurality of jacks is provided.

6. A high density access device according to claim 4, wherein said sub-module chassis is pivotally connected to said chassis frame, said sub-module chassis having a first position in which front access to said first plurality of jacks is not supplied, and a second pivoted position in which front access to said first plurality of jacks is provided.

7. A high density access device according to claim 4, wherein said sub-module chassis is slideably and pivotally connected to said chassis frame, said sub-module chassis having a first position in which front access to said first plurality of jacks is not supplied, and a second extended and pivoted position in which front access to said first plurality of jacks is provided.

8. A high density access device according to claim 1, wherein said sub-module chassis is mounted in a drawer connected to said chassis frame.

9. A high density access device according to claim 1, wherein said sub-module chassis is removably secured to said chassis frame, said sub-module chassis being removed from said chassis frame to enable access to said first plurality of ports.

10. A high density access device according to claim 1, wherein said sub-module chassis is slideably connected to said chassis frame, said sub-module chassis having a first position in which front access to said first plurality of jacks is not supplied, and a second extended position in which front access to said first plurality of jacks is provided.

11. A high density access device according to claim 1, wherein said sub-module chassis is pivotally connected to said chassis frame, said sub-module chassis having a first position in which front access to said first plurality of jacks is not supplied, and a second pivoted position in which front access to said first plurality of jacks is provided.

12. A high density access device according to claim 1, wherein said sub-module chassis is slideably and pivotally connected to said chassis frame, said sub-module chassis having a first position in which front access to said first plurality of jacks is not supplied, and a second extended and pivoted position in which front access to said first plurality of jacks is provided.

13. A high density front access device according to claim 1, wherein said first plurality of jacks substantially define a plane, said plane being located proximal of point half way between a front plane defined by said chassis frame and a back plane defined by said chassis frame.

14. A high density front access device according to claim 1, wherein said first plurality of jacks comprise at least one RJ-45 jack.

15. A high density front access device according to claim 1, wherein said first plurality of jacks comprise at least one of a telecom jack and an Amp Champ jack.

16. A high density device according to claim 1, further comprising a power supply, said power supply being connected to said chassis frame distal of said proximal face of said sub-module chassis.

17. A high density front access device according to claim 1, wherein said chassis frame exhibits a flange, said flange at least partially defining said passageway.

18. A high density front access device according to claim 1, wherein the device comprises midspan power insertion equipment supporting at least 40 ports.

19. A high density front access device according to claim 1, further comprising a network management jack.

20. A high density front access device according to claim 19, wherein said network management jack appears on said distal face of said sub-module chassis.

21. An apparatus for connecting a plurality of cables, the apparatus comprising:
a chassis frame arranged for mounting in a standardized telecommunications rack, said chassis frame exhibiting a front and a back;
a sub-module chassis connected to said chassis frame, said sub-module chassis exhibiting a proximal face and a distal face, said proximal face of said sub-module chassis exhibiting unobstructed access from said chassis frame front when said chassis frame is mounted in the standardized telecommunications rack;
a first plurality of jacks secured to said sub-module chassis and exhibiting unobstructed access from said chassis frame front; and
a second plurality of jacks secured in relation to said chassis frame and located distal of said proximal face of said sub-module chassis and proximal of said back of said chassis frame; and
a passageway formed between said sub-module chassis and said chassis frame, wherein said passageway enables the passage of at least one cable connected to said second plurality of jacks to a point substantially coplanar with said proximal face.

22. An apparatus according to claim 21, wherein at least one of said second plurality of jacks is secured to said sub-module chassis.

23. An apparatus for connecting a plurality of cables, the apparatus comprising:
a chassis frame configured and dimensioned for mounting in a standardized telecommunications rack, said chassis frame defining a front and a back;
a sub-module chassis connected to said chassis frame, said sub-module chassis exhibiting a front and a back;
a first plurality of jacks secured to said sub-module chassis, said first plurality of jacks facing said back of said chassis frame;
a second plurality of jacks secured to said sub-module chassis, said second plurality of jacks facing said front of said chassis frame; and
a passageway formed between said sub-module chassis and said chassis frame, said passageway arranged to enable the passage of at least one cable connected to said first plurality of jacks to a point substantially coplanar with said front of said chassis frame.

24. A midspan power insertion module comprising:
a chassis frame configured and dimensioned for mounting in a standardized telecommunications rack;
a sub-module chassis secured to said chassis frame, said sub-module chassis exhibiting a proximal face and a distal face;
a first plurality of jacks supporting at least 40 ports located distal of said proximal face of said sub-module chassis;
a second plurality of jacks supporting at least 40 ports appearing on said proximal face of said sub-module chassis; and
a passageway formed between said sub-module chassis and an inner wall of said chassis frame, said passageway arranged to enable the passage of cabling connected to said first plurality of jacks to a point substantially coplanar with said proximal face of said sub-module chassis.

* * * * *